United States Patent [19]
Danby et al.

[11] Patent Number: 5,495,171
[45] Date of Patent: Feb. 27, 1996

[54] EDDY CURRENT CONTROL IN NMR IMAGING SYSTEMS

[75] Inventors: Gordon T. Danby, Wading River; John W. Jackson, Shoreham; Charles E. Brukl, Fort Salonga, all of N.Y.; Krishna M. Gudimetta, Hammond, La.; Joseph F. Rimkunas, Massapequa, N.Y.

[73] Assignee: Fonar Corporation, Melville, N.Y.

[21] Appl. No.: 5,296

[22] Filed: Jan. 19, 1993

[51] Int. Cl.$^6$ ....................................................... G01V 3/00
[52] U.S. Cl. .......................................... 324/318; 128/653.5
[58] Field of Search .................................. 324/300, 307, 324/309, 318, 319, 322; 128/653.5; 335/296, 301; 336/84 C, 84 M

[56] References Cited

U.S. PATENT DOCUMENTS

| | | | |
|---|---|---|---|
| 2,962,636 | 11/1960 | Purcell | 324/319 |
| 4,890,083 | 12/1989 | Trenkler et al. | 335/301 |
| 4,920,011 | 4/1990 | Ogawa et al. | 335/301 |
| 4,980,641 | 12/1990 | Breneman et al. | 324/318 |
| 5,061,897 | 10/1991 | Danby et al. | 324/318 |

*Primary Examiner*—Louis M. Arana
*Attorney, Agent, or Firm*—Brooks Haidt Haffner & Delahunty

[57] ABSTRACT

A primary field magnet assembly, of the type used in magnetic resonance imaging systems, which has been designed with the capability to suppress eddy currents during magnetic resonance imaging through the use of eddy current suppressing material. In addition, this invention includes the use of high conductivity material to decouple the imaging system radio frequency antennas from their environment, which generally includes the primary field magnet assembly, and can be used to preserve the signal-to-noise performance of the scanner. Such highly conductive material is effective when employed in combination with the primary field magnet assembly described herein.

25 Claims, 6 Drawing Sheets

EDDY CURRENT CONTROL IN NMR IMAGING SYSTEMS

BACKGROUND OF THE INVENTION

The present invention pertains to the use of magnetic materials for the suppression of eddy currents, and the use of highly conductive materials to enhance signal-to-noise performance as related to radio frequency antennas of magnetic resonance (NMR) imaging systems.

Magnetic resonance imaging techniques in present use generally employ pulsed magnetic field gradients to spatially encode the nuclear magnetic resonance (NMR)signal from various portions of an anatomical region of interest. The pulsed magnetic field gradients together with radio frequency excitation of the nuclear spins, and acquisition of signal information are commonly referred to as a pulse sequence.

Pulsing current through a set of conductors will produce a magnetic field external to the conductor; the magnetic field generally has the same time course of development as the current flow in the conductors. The conductors may be distributed in space to produce three orthogonal gradients X, Y, Z. Each of the gradients may be independently pulsed by a separate time dependent current waveform. When the set of conductors is in close proximity to an electrically conductive object, such as the ferromagnetic pole of a primary field magnet assembly, pulsing magnetic field gradients will in turn generate currents and their associated magnetic fields in the electrically conductive object. These secondary magnetic fields oppose the establishment of the gradient magnetic fields. Such eddy currents thus create a delay in the establishment of steady state levels of the magnetic field gradients.

A typical imaging procedure involves the use of three orthogonal magnetic field gradients, Z, X and Y, which are pulsed coordinately along with bursts of radio frequency energy. An example of this is as follows: the Z gradient is pulsed on for two brief time periods during which a 90° radio frequency pulse in the first time period and a 180° radio frequency pulse in the second time period are used to select a slice of anatomy of interest and to induce the nuclear spin system within that slice to generate an NMR signal. Once the slice is selected by the Z gradient, the two remaining orthogonal gradients are used to confer spatial encoding on the NMR signal in the two orthogonal directions. Thus, the Y-gradient will encode on the basis of phase advances imparted on a series of signal responses by using a pulsed gradient waveform of progressively increasing area; and the X gradient, which is pulsed on during the signal collection period, will frequency encode the NMR signal in the third orthogonal direction.

The NMR signal will be processed to yield images which give an accurate representation of the anatomical features in the selected slice, as well as provide excellent soft tissue contrast. NMR signals may be processed using various algorithms depending upon the precise nature of the data acquisition procedure; however, all methods employed rely on the ability to spatially encode the signal information by making use of magnetic field gradients which are time modulated and sequentially pulsed in various modes to effect the desired result.

Since most of the aspects of a pulse sequence, such as radio frequency excitation of the nuclear spin system, and acquisition of spatially encoded information are predicated on the existence of stable, steady state magnetic field gradients, the existence of eddy currents lengthens the time course of the pulse sequence, and thus the imaging process. Also, eddy currents inhibit the ability to follow a faster imaging regimen which might yield potentially more valuable diagnostic information. A reduction or suppression in eddy currents is therefore a desirable goal in NMR imaging and is the subject of this invention.

The pulsed gradient sequence described above is by no means an exhaustive treatment of pulse sequences used in magnetic resonance imaging. More complete descriptions of pulse sequences and how they are varied to yield medically diagnostic information may be found in numerous publications, for example "Magnetic Resonance Imaging" by STARK, DAVID, D., and BRADLEY Jr., WILLIAM, G., (C.V. MOSBY COMPANY, 1988).

A traditional method used to overcome eddy currents is to overdrive the gradient voltage waveform during the early phases of establishment of desired magnetic field gradient levels. This method has proven effective in suppressing the effects of eddy currents. However, the method still limits the execution of pulse sequences with more rapidly switching magnetic field gradients, and must be tailored to the amplitude and duration of the individual waveforms. Furthermore, such methods do not address the problem of spatial dependence of the eddy currents, leaving only best compromise solutions to cope with the variations in eddy current magnitude and duration across the imaging region of interest.

SUMMARY OF THE INVENTION

The present invention addresses these shortcomings and provides a means to effectively suppress eddy currents through the use of materials which possess desirable magnetic permeability and electrical resistivity. In addition, the present invention employs highly conductive materials to enhance the signal-to-noise performance of medical NMR imaging systems.

There are several desirable properties which materials require in order to effectively reduce the time course of eddy currents. In fact, soft magnetic materials as a class of materials generally possess these properties, although various soft magnetic materials will exhibit such properties to differing degrees and in different combinations.

In particular, the magnetic permeability and the electrical resistivity are important parameters. A high permeability will allow a particular material to carry more magnetic flux than material with lesser permeability. Once the capacity of the material to carry flux is exceeded, leakage will occur resulting in establishment of a fringe magnetic field outside the physical boundaries of the material. One of the major benefits of using ferromagnetic material is the relatively high permeability. Alloys comprised of the ferromagnetic elements iron, cobalt and nickel are able to achieve permeability values as high as 300,000 and are therefore referred to as high permeability materials.

Another materials parameter of importance to the present invention is the electrical resistivity. Materials with higher electrical resistivity have reduced current carrying capacity. This property serves to inhibit the formation of eddy currents, which is clearly a desirable feature in the present situation.

Thus, a combination of high permeability to contain the gradient magnetic field, and high electrical resistivity to prevent the formation of eddy currents is desirable; materials possessing such properties, including soft magnetic materials, are beneficial when incorporated into the primary field magnet assembly of a magnetic resonance imaging system. A number of embodiments of the present invention detailed below take advantage of such materials.

In addition to the desirable properties of permeability and resistivity, soft magnetic materials tend to have low coercivity. In fact, materials exhibiting coercivity values less than 5 Oersteds are considered soft. Low coercivity materials have a generally narrower hysteresis loop when B, magnetic induction, is plotted versus H, the magnetizing field. Since the loss in energy is directly related to the area of the hysteresis loop, a narrow loop implies a more efficient material in terms of its magnetic field properties.

High permeability materials which exhibit the desirable properties mentioned above function effectively in transient magnetic fields where the frequency components of the transient are in the audio range, i.e. less than approximately 10 KHz. These same materials however are typically subjected to electromagnetic radiation in the radio frequency range during the imaging procedure. Indeed, radio frequencies used today in magnetic resonance imaging span a broad range from approximately 1 MHz to approximately 200 MHz.

Under conditions which exist in magnetic resonance imaging, high permeability materials may couple to the radio frequency antennas causing a reduction in the Q-factor of the tuned antennas. The Q-factor of an antenna is directly related to the signal-to-noise (S/N) performance of a magnetic resonance imaging system, with S/N $\alpha \sqrt{Q\text{-factor}}$. The desirable properties of high permeability materials as related to suppressing eddy currents may therefore deteriorate the signal-to-noise performance of the magnetic resonance scanner. This effect is at least partially related to the proximity of the RF antennas to the highly permeable material, with the deterioration more pronounced as the antennas approach the high permeability material. However, the present invention includes the novel practice of employing highly conductive material, which has the effect of generally decoupling the radio frequency antennas from their environment.

The present invention details the implementation of layers of highly conductive material of the proper thickness which restores the Q-factor of the radio frequency antennas, thereby improving signal-to-noise ratio over the situation devoid of such a highly conductive layer. Since highly conductive materials are also capable of conducting and perpetuating eddy currents, the proper balance needs to be achieved when combining materials which suppress eddy currents at the expense of reducing the radio frequency antenna performance, and materials which preserve the Q factor of the radio frequency antennas at the expense of perpetuating eddy currents. This balance is achieved in the present invention.

High permeability materials are of many physical and chemical types including ferrites, bonded metal particulates, unbonded metal particulates, composites, metals and metal alloys. An earlier invention, commonly assigned U.S. Pat. No. 5,061,897, included some members of this group, or more specifically, those with a magnetic permeability greater than 1000, and an electrical resistivity at least 1000 micro ohm -cm. Metals and metal alloys in general were excluded on the basis of the electrical resistivity criteria since such materials have resistivity less than 1000 micro ohm -cm.

Additional investigation into high permeability materials where electrical resistivity is less than 1000 micro ohm -cm, has identified a class of materials which effectively suppresses eddy currents. Unlike the materials which are included under commonly assigned U.S. Pat. No. 5,061,897, the materials which are the subject of the present invention include metals and metal alloys which possess specific characteristics as related to initial permeability and electrical resistivity. Such materials are herein referred to as eddy current suppressing materials.

This invention includes metal alloys comprising nickel, iron, cobalt, chromium, molybdenum, copper, and aluminum, in a solid homogeneous form, in contrast to the same metal alloys in a particulate composite form which was an embodiment of the earlier invention. In addition, the present invention includes embodiments which combine the use of high permeability materials in general with highly conductive materials; and embodiments for the general implementation of highly conductive materials to decouple the radio frequency antennas from the environment.

DETAILED DESCRIPTION OF THE PREFERRED EMBODIMENTS

The present invention comprises a primary field magnet assembly, of the type used in medical magnetic resonance imaging systems, which has been designed with the capability to suppress eddy currents during magnetic resonance imaging through the use of eddy current suppressing material. In addition, this invention includes the use of high conductivity material to decouple the radio frequency antennas from their environment, and to preserve the signal-to-noise performance of the imaging system. Such high conductivity material is highly effective when employed in combination with a primary field magnet assembly as described herein.

Figure 1:
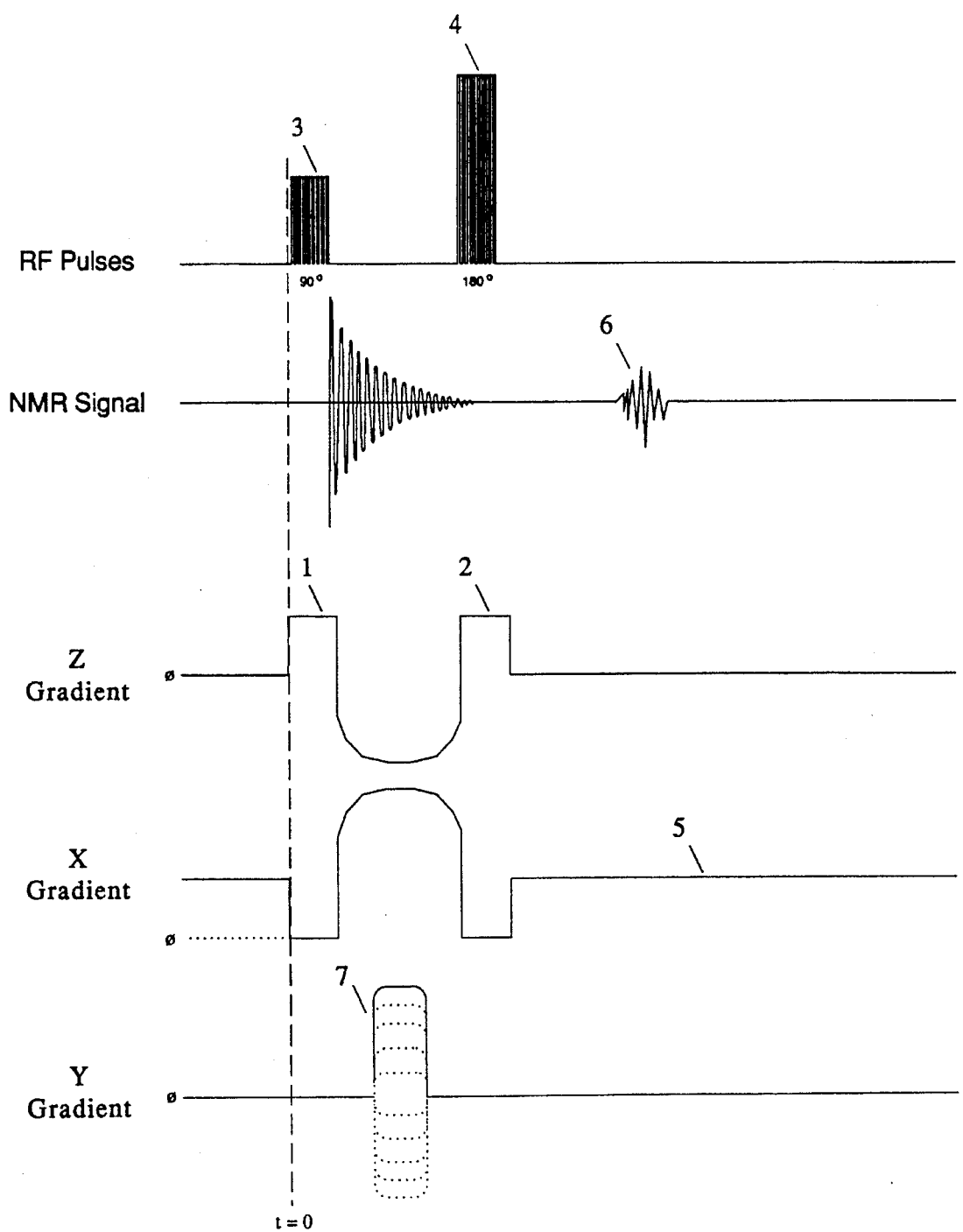
FIG. 1: A diagram of a typical pulse sequence used in magnetic resonance imaging.

The importance of suppressing eddy currents in conductive magnetic resonance imaging can be seen by examining FIG. 1 which shows a simplified, but typical, pulse sequence. Three orthogonal magnetic field gradient waveforms, labelled Z, X and Y, define the spatial encoding of the anatomical region of interest to be imaged. As represented in FIG. 1, the Z-gradient waveform defines the slice select function and will determine the thickness of the anatomical slice to be imaged. The plateau portions of the waveform, 1 and 2, correspond to the periods of time in the pulse sequence where respectively, the 90° 3, and 180° 4, radio frequency pulses, which are used to excite the nuclear spin system, take place. Once the slice thickness has been defined, resolution in the two orthogonal directions is determined by the X- and Y-gradients. For example, in FIG. 1, the X-gradient performs the read out function in the pulse sequence and has achieved a plateau 5, during the data collection of the NMR signal 6. The Y-gradient 7, functions as a phase encoding gradient, and advances the phase of the NMR signal by progressively increasing the amplitude, on repetitions of the pulse sequence. The image data are formed from a collection of numerous NMR signal 6, where each signal is spatially encoded differently through an advance of the phase encoding gradient 7.

It is to be appreciated that each of the switching magnetic field gradients must achieve the desired levels of magnetic field strength in a timely manner as represented in FIG. 1, in order to functionally coordinate with the other magnetic field gradients, the RF pulses and the collection of the NMR signal. Eddy currents retard the establishment of desired levels of the magnetic field gradient and therefore limit the speed of the pulse sequence.

The designation of the X-, Y- and Z-gradients in this illustration is arbitrary, and in common practice any of the three orthogonal gradients, or combinations thereof, can function as a slice select gradient, readout gradient, or phase encode gradient. Therefore, when gradients are employed in any such manner, it is to be considered within the scope of this invention. Additionally, the development of imaging technology has resulted in more complicated gradient waveforms and pulse sequences. The pulse sequence in FIG. 1 is merely illustrative and not meant to limit the scope of this invention.

As magnetic resonance imaging technology has improved, there has been a trend toward faster pulse sequences. Magnetic field gradient switching times on the order of hundreds of microseconds are desirable. Furthermore, shorter switching times have been accompanied by the need to achieve greater gradient amplitudes concomitant with the desire for improved spatial resolution in the images. These developments have all contributed to the need to improve eddy current control.

Figure 2:
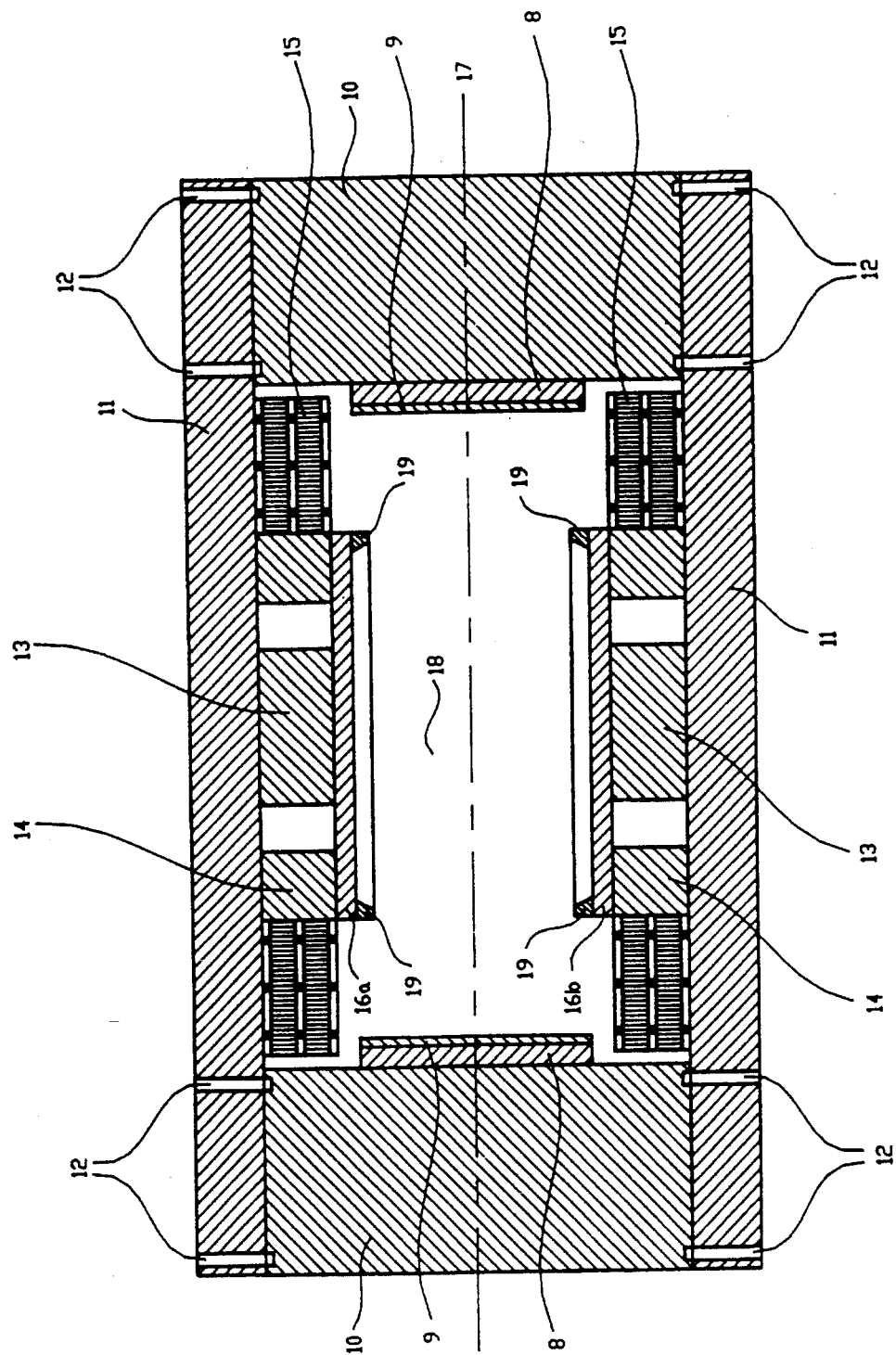
FIG. 2: A cross-sectional view of an iron core magnet.

One embodiment of the present invention is shown in FIG. 2 which contains elements of the primary field magnet assembly shown in cross-section. The assembly has two vertical members 10, and two horizontal members 11, which are connected in each of the four corners by a pair of bolts, 12. Connected to each of the two horizontal members 11, and centrally located thereon is a cylindrical member 13, surrounded by a concentric annular ring, 14. The vertical members 10, horizontal members 11, connecting bolts 12, cylindrical members, 13 and annular rings, 14 are comprised of ferromagnetic material, and taken together, comprise the ferromagnetic structure of the primary field magnet assembly.

Also shown in FIG. 2 is the means for generating magnetic flux, 15. The magnetic flux generating means, 15, is disposed in the region between the vertical members 10, and the annular ring 14. The magnetic flux generating means essentially surrounds the annular ring 14, and is in close proximity to both the annular ring 14, and the horizontal member 11. An essential feature of the primary field magnet assembly is the efficient coupling between the ferromagnetic structure and the magnetic flux generating means. The stronger this coupling, the greater will be the proportion of magnetic flux carried by the ferromagnetic structure and consequently the higher will be the magnetic field value as measured in the magnet gap 18. The magnetic flux generating means may be comprised of permanent magnet material, resistive electromagnetic windings, or superconductive windings.

Taken together, the cylindrical member 13, and annular ring 14 constitute the support structure for each of the pole pieces 16a and 16b. The two pole pieces, 16a and 16b, are arranged in opposed fashion, with each pole approximately equidistant from an imaginary horizontal line, 17, passing midway through the primary field magnet assembly, and with the centers of each pole aligned vertically with each other. Each pole is comprised of ferromagnetic material and is attached to the support structure for maximum coupling.

The separation of the two poles defines a region of space commonly called the magnet gap 18, into which the anatomical region of interest of a patient is placed preparatory to a magnetic resonance imaging procedure. This magnet gap also defines an area containing a highly uniform magnetic field, where the magnetic flux originates in one pole, for example 16a, and terminates in the other pole, for example 16b. The magnetic flux passes through the pole piece and into the ferromagnetic structure, which provides a return path for the magnetic flux to the pole piece, 16a, which was designated as the point of origin for magnetic flux in this discussion. It should be clear that this example is not meant to exclude the possibility of the direction of the magnetic field being opposite to what has been described. The direction of the magnetic field is easily chosen by one skilled in the art.

In providing a return path for the magnetic flux which crosses the magnet gap, the ferromagnetic structure also directs and generally contains the magnet flux. More efficient primary field magnet assemblies may be constructed by increased coupling between the ferromagnetic structure and the ferromagnetic poles. The embodiment shown herein has the ferromagnetic structure contiguous with the ferromagnetic poles, and is indicative of a high degree of magnetic coupling.

Figure 3:
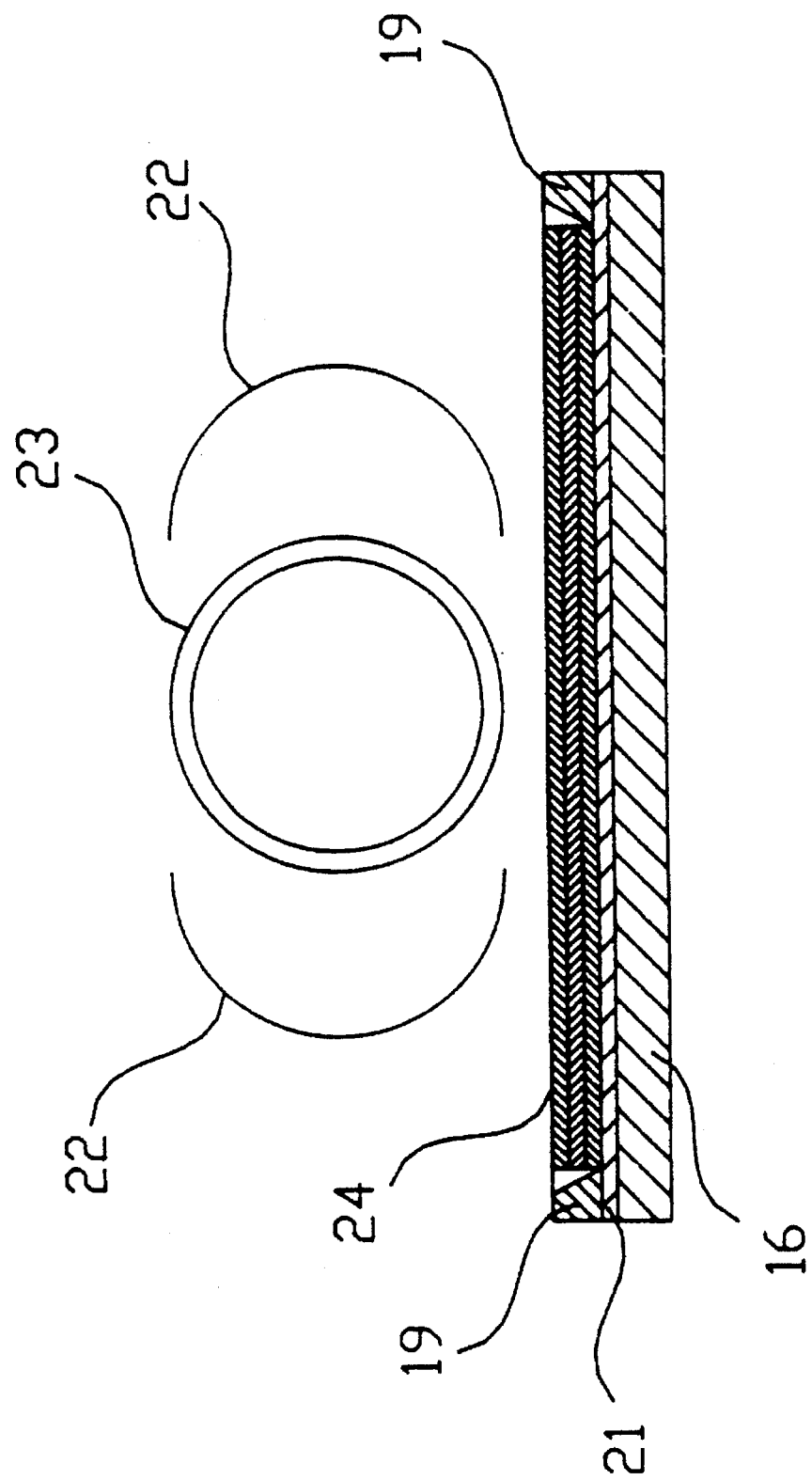
FIG. 3: A cross-sectional view of a ferromagnetic pole including a thickness of eddy current suppressing material, and schematic representation of subassemblies of a magnetic resonance imaging system.

As shown in FIG. 2, the portion of the region of space which is in close proximity to the ferromagnetic poles contains additional subassemblies such as a shim bar 19. A more detailed description of the structural features of the subassemblies and their relationship to the ferromagnetic pole may be seen in a cross-section view in FIG. 3. In the preferred embodiment, the ferromagnetic pole 16, and shim bar 19, are circular. A thickness of eddy current suppressing material 21, is placed proximate and generally coextensive with, the ferromagnetic pole, 16. Subassemblies, in addition to the shim bar 19, which are necessary for conducting magnetic resonance imaging procedures are placed in the magnet gap. The additional subassemblies include, but are not limited to, radio frequency antennas for transmitting 22, and receiving 23, radio frequency energy during the imaging procedure; and a set of conductors 24 which, when arranged in the proper spatial relationship to one another, are capable of generating the three orthogonal magnetic field gradients, X, Y and Z. As schematically represented in FIG. 3, the set of conductors 24, is arranged in a triple layer structure placed in the magnet gap, where each layer represents a grouping of conductors capable of generating one of the three orthogonal gradients, X, Y or Z. Such additions to the primary field magnet assembly are generally typical of modern day NMR medical imaging systems.

The thickness of eddy current suppressing material 21, has magnetic and electrical properties which enable it to effectively suppress eddy currents. The initial magnetic permeability of such materials is greater than 1000. When the materials are subjected to increasing levels of external magnetic field, the magnetic permeability decreases precipitously at a point where the material becomes saturated. Sufficiently high values of permeability are necessary for the present invention in order to provide a means to contain the magnetic fields generated by the pulsed gradients during magnetic resonance imaging. In addition, however, the values of magnetic field at which saturation occurs for the eddy current suppressing material must be sufficiently high in order to permit such materials to operate effectively at magnetic field strength values of the primary field magnet.

For the eddy current suppressing materials to be effective, they must possess sufficiently high electrical resistivity to suppress the formation of eddy currents which are generated in such materials by the pulsing magnetic fields. Some materials with electrical resistivity less than 1000 micro ohm -cm are effective in significantly reducing eddy currents.

Eddy current suppressing materials with the combined properties of initial magnetic permeability greater than 1000, and electrical resistivity less than 1000 micro ohm -cm represent a class of materials capable of containing the magnetic flux generated by the pulsed magnetic field gradients and suppressing eddy currents which are generated by this process.

Eddy current suppressing materials which exhibit the combination of desirable properties of initial permeability and electrical resistivity include metals and metal alloys. Metals and metal alloys exhibit the physical characteristics of being solid and homogeneous. As used herein, a solid is defined as a material which has been made by any commonly employed metallurgical technique yielding a finished material which is metallurgically virtually one hundred percent dense. Also, as used herein, the term homogeneous refers to a material whose individual grains have the same physical, electrical and magnetic properties as does the identical material in bulk form. It is to be understood that the individual grains of the material are comprised of all microstructural components and characteristics which are common to the bulk material as a whole.

One type of metal alloy from the group of eddy current suppressing materials which exhibits the desirable properties of initial permeability and electrical resistivity is the nickel-iron alloys. Nickel-iron alloys vary in nickel content from as low as 35% (n.b., all percentages recited herein are on the basis of weight) to as much as 80%. The remaining alloy percentage is primarily comprised of iron, with different nickel-iron alloys containing smaller amounts of other elements. Examples of other elements include, but are not limited to, molybdenum, silicon, manganese, carbon, copper and chromium.

Varying the weight percentage composition of an eddy current suppressing material predominantly comprised of nickel and iron changes the operating characteristics of the material. To illustrate, commercially available material comprising 80% nickel has an initial permeability off 35,000, a maximum permeability of 350,000, and will become saturated at 8,200 gauss; whereas, a material comprising 48% of nickel has an initial permeability of 11,000, a maximum permeability of 100,000, and saturates at 15,200 gauss. Variations in the precise nickel content of the eddy current suppressing material chosen will be determined by the details of the intended use. However, it should be clear that any use of nickel-iron alloy materials in particular, and eddy current suppressing materials in general, with the combined properties of initial permeability greater than 1000 and electrical resistivity less than 1000 micro ohm -cm constitutes practice of the present invention.

A primary field magnet assembly including a ferromagnetic pole which employs eddy current suppressing material disposed on the pole and comprising 80% nickel is the preferred embodiment of this invention. Such materials are commercially available under various trade names, including, as an example, "Permalloy 80."

Figure 4:
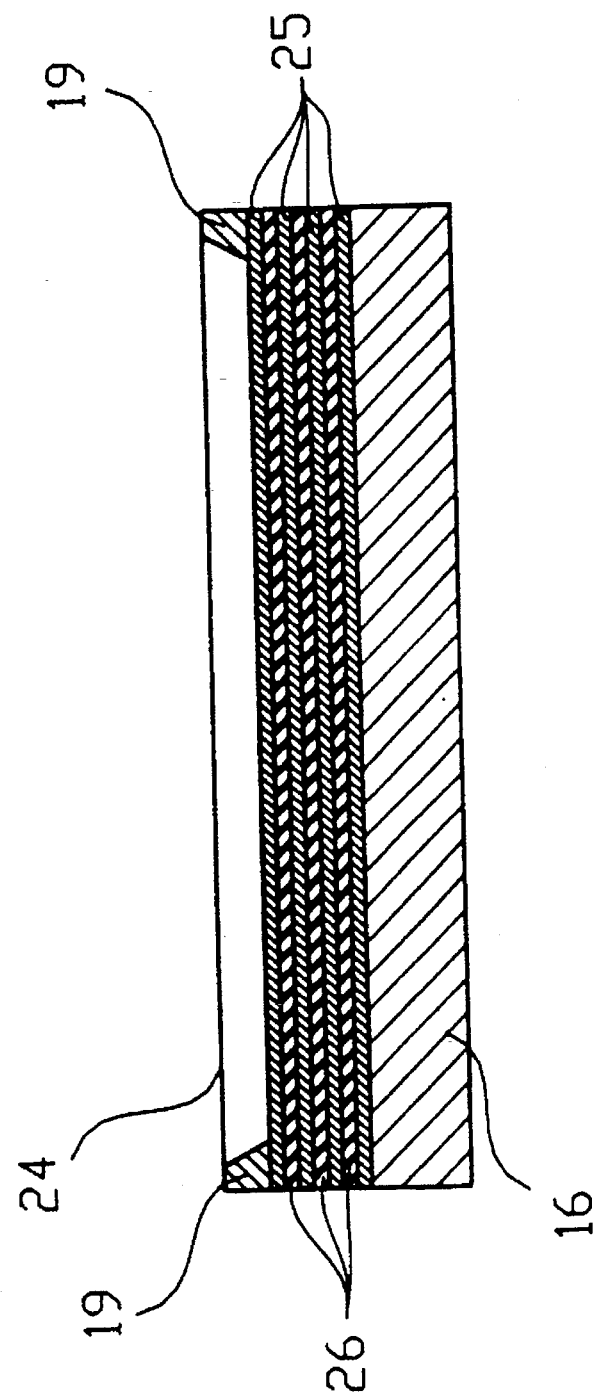
FIG. 4: A cross-sectional view of a ferromagnetic pole including a multiple layer thickness of high permeability material.

The thickness of eddy current suppressing material may be implemented as a single layer 21, as shown in FIG. 3, or consisting of more than one layer. In the latter case, the desired thickness is achieved by constructing a stacked package of multiple layers of material. As shown in FIG. 4, each layer of eddy current suppressing material 25 is electrically isolated from neighboring layers by a layer of insulating material 26. The thickness of the stacked package of eddy current suppressing material is thus composed of a multiplicity of alternating layers of the eddy current suppressing material and the electrically insulating material. Alternatively, the stacked package of multiple layers of eddy current suppressing material may be constructed from a multiplicity of layers without the layers of electrically insulating material interleaved between them. Each of these alternatives to achieving a total thickness of material necessary to effectively suppress eddy currents is an alternative embodiment of the present invention.

A subject of commonly assigned U.S. Pat. No. 5,061,897 was high permeability materials including ferrites, bonded particulate metals, unbonded particulate metals, composites incorporating particulate metals, and combinations thereof. These materials as a group, are characterized by relatively high electrical resistivity, generally greater than 1000 micro ohm -cm. In contrast, the present invention incorporates materials with electrical resistivity less than 1000 micro ohm -cm which also effectively suppress eddy currents, and are useful when incorporated into the primary field magnet assembly of NMR medical scanners.

Figure 5:
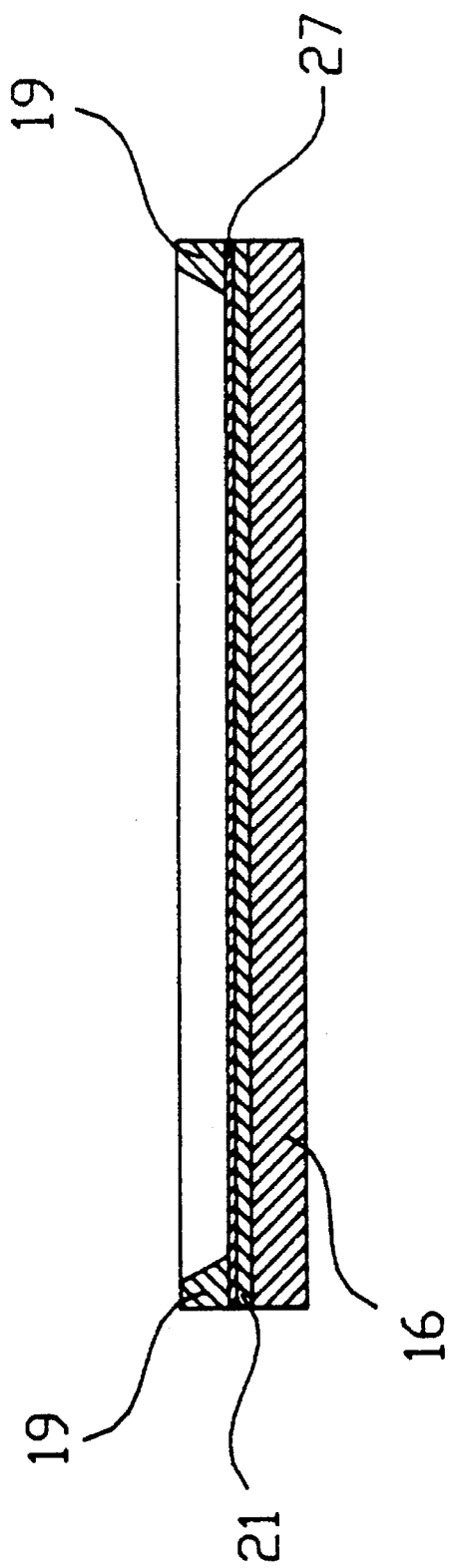
FIG. 5: A cross-sectional view of a ferromagnetic pole including a thickness of high permeability material and a layer of highly conductive material.

The placement of radio frequency antennas in the proximity of high permeability materials, such as eddy current suppressing material, or those which are the subject of commonly assigned U.S. Pat. No. 5,061,897, can result in coupling between the radio frequency antennas and the highly permeable materials. Such coupling reduces the Q-factor of the RF antennas and results in a loss in signal-to-noise during the imaging procedure. The inclusion of a relatively thin layer of highly conductive material between the radio frequency antennas and the highly permeable material employed to suppress eddy currents decouples the radio frequency antennas and restores the Q-factor of these antennas, resulting in the restoration and preservation of signal-to-noise. Since highly conductive materials are capable of sustaining eddy currents, only thin layers can be tolerated so as not to counteract the eddy current suppressing material characteristics of the highly permeable materials. Thus, highly conductive materials may be employed in combination with high permeability materials as shown in FIG. 5. In the preferred embodiment, a sheet of highly conductive material 27, is added in a fashion overlying and approximately coextensive with, the thickness off eddy current suppressing material, and beneath the shim bar ring. The highly conductive material in this embodiment, is aluminum, having a thickness of approximately 0.0003 inches. Highly conductive layers of aluminum with a thickness of approximately 0.0005 inches have proven slightly more effective at improving the Q-factor of the radio frequency antennas, with a concomitantly small additional reduction of the effectiveness of the eddy current suppressing material.

Figure 6:
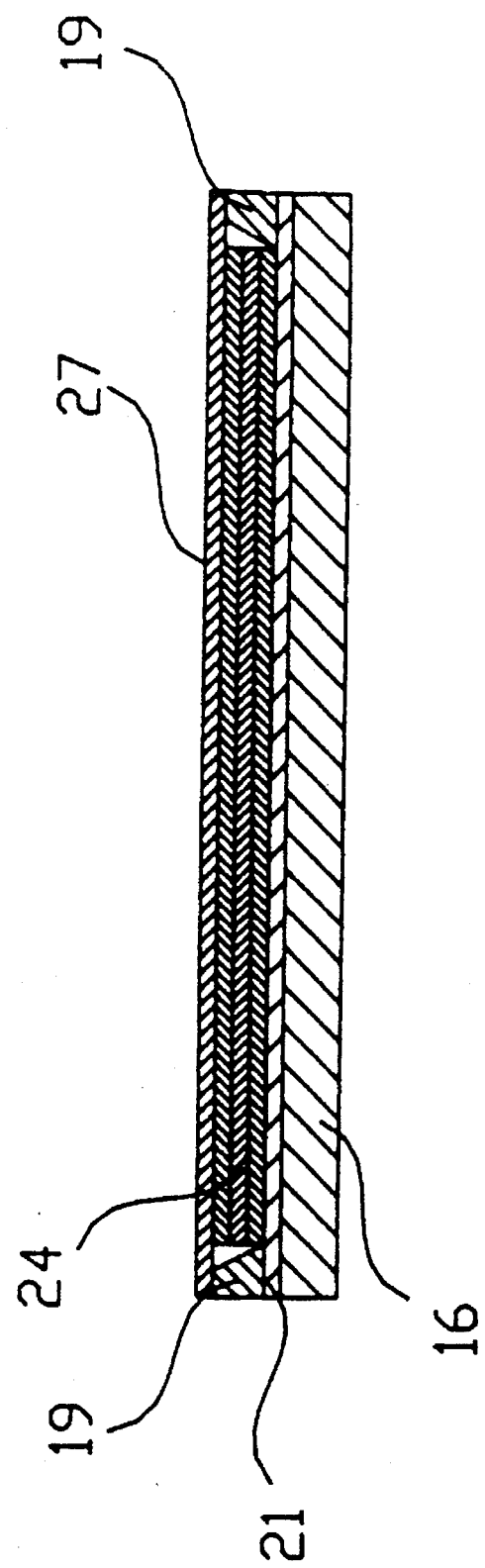
FIG. 6: A cross-sectional view of a ferromagnetic pole with highly conductive material layer, a set of conductors, (schematically represented) and a thickness of high permeability material.

There are several variations of the preferred embodiment. Other highly conductive materials from a group including copper, silver, and gold, as well as aluminum, or combinations thereof, may be used. Also, a different thickness of material may be desirable, depending upon the highly conductive material selected. Moreover, the layer of highly conductive material need only be placed between the highly permeable material and the radio frequency antennas and not necessarily in close proximity to the highly permeable material. This is illustrated in FIG. 6 which shows the layer of highly conductive material 27, placed overlying subassemblies such as the set of conductors 24, and shim bar 19. It should be understood that these alternative embodiments constitute practice of the present invention.

In addition to using highly conductive materials to decouple radio frequency antennas from highly permeable materials in NMR medical imagers, employing highly conductive material is beneficial as a means for decoupling radio frequency antennas generally from environmental factors which reduce signal-to-noise performance by coupling with the RF antennas. As an example, large antennas, or antennas placed in proximity to elements of the primary field magnet assembly, may perform poorly due to coupling between the antennas and such elements. These elements include, but are not limited to shim bars, or portions of the ferromagnetic structure. Placement of a thin sheet of highly conductive material between the RF antennas and these elements will enhance the signal-to-noise performance of the imaging system. Thus, the use of highly conductive material to decouple RF antennas from environmental factors in general is an embodiment of this invention and is independent of the presence of eddy current suppressing highly permeable material in the primary field magnet assembly.

Another embodiment of the present invention involves upgrading a medical NMR scanning apparatus to improve the eddy current response characteristics.

The existence of subassemblies in close proximity to the ferromagnetic pole as is shown in FIG. 3 may obscure the access required to incorporate the high permeability magnetic material, or high conductivity material in situations, for example, where a magnetic resonance imaging apparatus has already been constructed. Such a situation will require providing access to the pole surface, and may involve separating subassemblies from the ferromagnetic pole sufficiently to allow placement of the high permeability magnetic material, high conductivity material, or both. Following these placement steps, either the same subassemblies as were originally separated from the proximity of the ferromagnetic pole surface, or different subassemblies, will be secured such that the final configuration of the primary field magnet assembly, ferromagnetic pole and subassemblies are capable of performing magnetic resonance imaging.

As alternative embodiments of this upgrade method, it is possible to alter the steps of this method and still achieve a desirable result. For example, the step of placing the layer of high conductivity material for preventing radio frequency absorption could be conducted after the step of securing at least some of the subassemblies into said primary field magnet assembly. This method would permit, for example, securing the set of conductors which are used to generate the magnetic field gradients, prior to placement of the layer of highly conductive material. Additionally, in situations where the high permeability magnetic material is not necessary or desirable, the method of upgrading could still be conducted while eliminating the step of placing a thickness of high permeability magnetic material.

Eddy currents can only exist in electrically conductive materials. Thus, all elements of the primary field magnet assembly, in addition to the ferromagnetic pole, which are electrically conductive are capable of supporting eddy currents. In yet another embodiment, highly permeable materials may therefore be employed generally to reduce eddy currents in electrically conductive portions of the magnet assembly. Such highly permeable materials include eddy current suppressing materials, and materials covered in commonly assigned U.S. Pat. No. 5,061,897.

This embodiment is illustrated in FIG. 2, where for example, a thickness of highly permeable material, 8, is used to cover portions of the electrically conductive ferromagnetic vertical member 10, of the primary field magnet assembly. The thickness of highly permeable material 8, may be a single layer, or a multiplicity of layers where each layer is electrically insulated from other layers, or where the layers of highly permeable material are electrically conductive with each other. The construction of the multiple layer thickness is the same as described earlier with reference to FIG. 4. This embodiment may be equally well practiced on any electrically conductive elements of the primary field magnet assembly.

In another embodiment shown in FIG. 2, a layer of highly conductive material, 9, may also be incorporated overlying electrically conductive portions of the magnet assembly to decouple the radio frequency antennas and improve their signal-to-noise performance. The practice of this embodiment is beneficial when the highly conductive material, 9, is implemented proximate to, and approximately co-extensive with the high permeability magnet material, 8, used to suppress eddy currents. However, implementation of highly conductive material in general to decouple radio frequency antennas from electrically conductive portions of the magnet assembly even in cases where high permeability magnet material is not employed, is also beneficial and is an embodiment of this invention.

We claim:

1. A primary field magnet assembly for use in medical NMR imaging systems, comprising:
   a) a ferromagnetic structure which provides a return path for magnetic flux,
   b) means for generating said magnetic flux, said means magnetically coupled to said ferromagnetic structure to establish magnetic flux flowing through said ferromagnetic structure,
   c) two opposed ferromagnetic poles spaced apart from one another and forming a gap therebetween for receiving a portion of human anatomy therein, said ferromagnetic poles being magnetically coupled to said ferromagnetic structure to develop a magnetic field between said poles,
   d) a layer of high permeability magnetic material, said material providing means to reduce eddy currents in said ferromagnetic poles, and said material placed proximate to a surface of each said pole which faces said gap, and
   e) means for preventing radio frequency absorption by said high permeability magnetic material, said means overlying said high permeability magnetic material for each of said ferromagnetic poles.

2. The primary field magnet assembly as described in claim 1, wherein said means for generating magnetic flux comprises permanent magnetic material.

3. The primary field magnet assembly as described in claim 1, wherein said means for generating magnetic flux comprises resistive electromagnetic windings.

4. The primary field magnet assembly as described in claim 1, wherein said means for generating magnetic flux comprises superconductive windings.

5. The primary field magnet assembly as described in claim 1, wherein said high permeability material comprises eddy current suppressing material having an initial permeability greater than approximately 1000 and a resistivity less than 1000 micro ohm-cm.

6. The primary field magnet assembly as described in claim 1, wherein said high permeability magnetic material is a nickel-iron alloy comprising at least 35% nickel.

7. The primary field magnet assembly as described in claim 1, wherein said high permeability magnetic material is a nickel-iron alloy comprising approximately 80% nickel, approximately 15% iron, and the remaining approximately 5% comprising at least one element of the group consisting of molybdenum, silicon, manganese, copper and carbon.

8. The primary field magnet assembly as described in claim 7, wherein said high permeability magnetic material is a nickel-iron alloy comprising about 80% nickel, 14.93% iron, 4.2% molybdenum, 0.35% silicon, 0.5% manganese, and 0.02% carbon.

9. The primary field magnet assembly as described in claim 1, wherein said high permeability magnetic material is selected from a group consisting of ferrites, bonded particulate metals, unbonded particulate metals, composites incorporating particulate metals and combinations thereof.

10. The primary field magnet assembly as described in claim 1, wherein said high permeability magnetic material comprises a single layer.

11. The primary field magnet assembly as described in claim 1, wherein said high permeability magnetic material comprises multiple layers.

12. The primary field magnet assembly as described in claim 11, wherein each layer of said multiple layers of high permeability magnetic material is electrically isolated from other layers of said multiple layers.

13. The primary field magnet assembly as described in claim 1, further comprising a set of conductors for generating magnetic field gradients for conducting magnetic resonance imaging, said set of conductors placed between said high permeability magnetic material and said means for preventing radio frequency absorption, for each of said poles.

14. The primary field magnet assembly as described in claim 1, further comprising a set of conductors for generating magnetic field gradients for conducting magnetic resonance imaging, said set of conductors placed overlying said means for preventing radio frequency absorption, for each of said poles.

15. The primary field magnet assembly as described in claim 1, wherein said means of preventing radio frequency absorption comprises high electrical conductivity material.

16. The primary field magnet assembly as described in claim 1, wherein said means of preventing radio frequency absorption comprises at least one element of the group consisting of aluminum, copper, silver and gold.

17. The primary field magnet assembly as described in claim 1, wherein said means of preventing radio frequency absorption has a thickness of approximately 0.0003 inches.

18. The primary field magnet assembly as described in claim 1, wherein said layer of high permeability material is in a substantially homogeneous solid form.

19. A primary field magnet assembly for use in medical NMR imaging systems, comprising:

a) a ferromagnetic structure which provides a return path for magnetic flux, b) means for generating said magnetic flux, said means magnetically coupled to said ferromagnetic structure to establish magnetic flux flowing through said ferromagnetic structure, c) two opposed ferromagnetic poles spaced apart from one another and forming a gap therebetween for receiving a portion of human anatomy therein, said ferromagnetic poles being magnetically coupled to said ferromagnetic structure to develop a magnetic field between said poles, (d) a set of conductors overlying each of said ferromagnetic poles, each of said set of conductors for generating magnetic field gradients, and e) means for preventing radio frequency absorption by said ferromagnetic poles, said means overlying each of said set of conductors.

20. The primary field magnet assembly as described in claim 19, wherein said means for generating magnetic flux comprises permanent magnetic material.

21. The primary field magnet assembly as described in claim 19, wherein said means for generating magnetic flux comprises resistive electromagnetic windings.

22. The primary field magnet assembly as described in claim 19, wherein said means for generating magnetic flux comprises superconductive windings.

23. The primary field magnet assembly as described in claim 19, wherein said means for preventing radio frequency absorption comprises high electrical conductivity material.

24. The primary field magnet assembly as described in claim 19, wherein said means for preventing radio frequency absorption comprises at least one element of the group consisting of aluminum, copper, silver and gold.

25. The primary field magnet assembly as described in claim 19, wherein said means for preventing radio frequency absorption has a thickness of approximately 0.0003 inches.

* * * * *